United States Patent
Shim et al.

(10) Patent No.: US 9,082,488 B2
(45) Date of Patent: Jul. 14, 2015

(54) FLASH MEMORY DEVICE AND METHOD OF PROGRAMMING THE SAME

(71) Applicant: SK hynix Inc., Icheon-si, Gyeonggi-do (KR)

(72) Inventors: Jung Woon Shim, Incheon (KR); Sung Jae Chung, Seoul (KR); Jin Gu Kim, Suwon-si (KR); Dong Hwan Lee, Seoul (KR); Seung Won Kim, Yongin-si (KR); Su Min Yi, Yangsan-si (KR)

(73) Assignee: SK HYNIX INC., Icheon-si, Gyeonggi-do (KR)

( * ) Notice: Subject to any disclaimer, the term of this patent is extended or adjusted under 35 U.S.C. 154(b) by 128 days.

(21) Appl. No.: 13/719,201

(22) Filed: Dec. 18, 2012

(65) Prior Publication Data

US 2014/0063968 A1    Mar. 6, 2014

(30) Foreign Application Priority Data

Aug. 30, 2012  (KR) ................ 10-2012-0095644

(51) Int. Cl.
  *G11C 16/12* (2006.01)
  *G11C 16/10* (2006.01)
  *G11C 16/06* (2006.01)
  *G11C 16/04* (2006.01)
  *G11C 16/34* (2006.01)

(52) U.S. Cl.
  CPC ............ *G11C 16/10* (2013.01); *G11C 16/0483* (2013.01); *G11C 16/06* (2013.01); *G11C 16/3459* (2013.01)

(58) Field of Classification Search
  CPC .... G11C 16/10; G11C 16/06; G11C 16/0483; G11C 16/3459
  USPC ......................................... 365/185.19, 185.22
  See application file for complete search history.

(56) References Cited

U.S. PATENT DOCUMENTS

| | | | |
|---|---|---|---|
| 2004/0264264 A1* | 12/2004 | Yaegashi et al. | 365/199 |
| 2011/0161571 A1* | 6/2011 | Kim et al. | 711/103 |
| 2012/0140566 A1* | 6/2012 | Aritome et al. | 365/185.19 |

FOREIGN PATENT DOCUMENTS

KR    1020100098145 A    9/2010

* cited by examiner

*Primary Examiner* — J. H. Hur
*Assistant Examiner* — Xiaochun L Chen
(74) *Attorney, Agent, or Firm* — Haynes and Boone, LLP

(57) ABSTRACT

A semiconductor memory device includes a memory block configured to include memory cells coupled to word lines and a peripheral circuit configured to perform a first program operation, a program verifying operation and a second program verifying operation for memory cells coupled to a word line selected from the word lines, and supply program allowable voltages having different levels to selected bit lines of program allowable cells located between program inhibition cells in the first program operation and the second program operation.

18 Claims, 8 Drawing Sheets

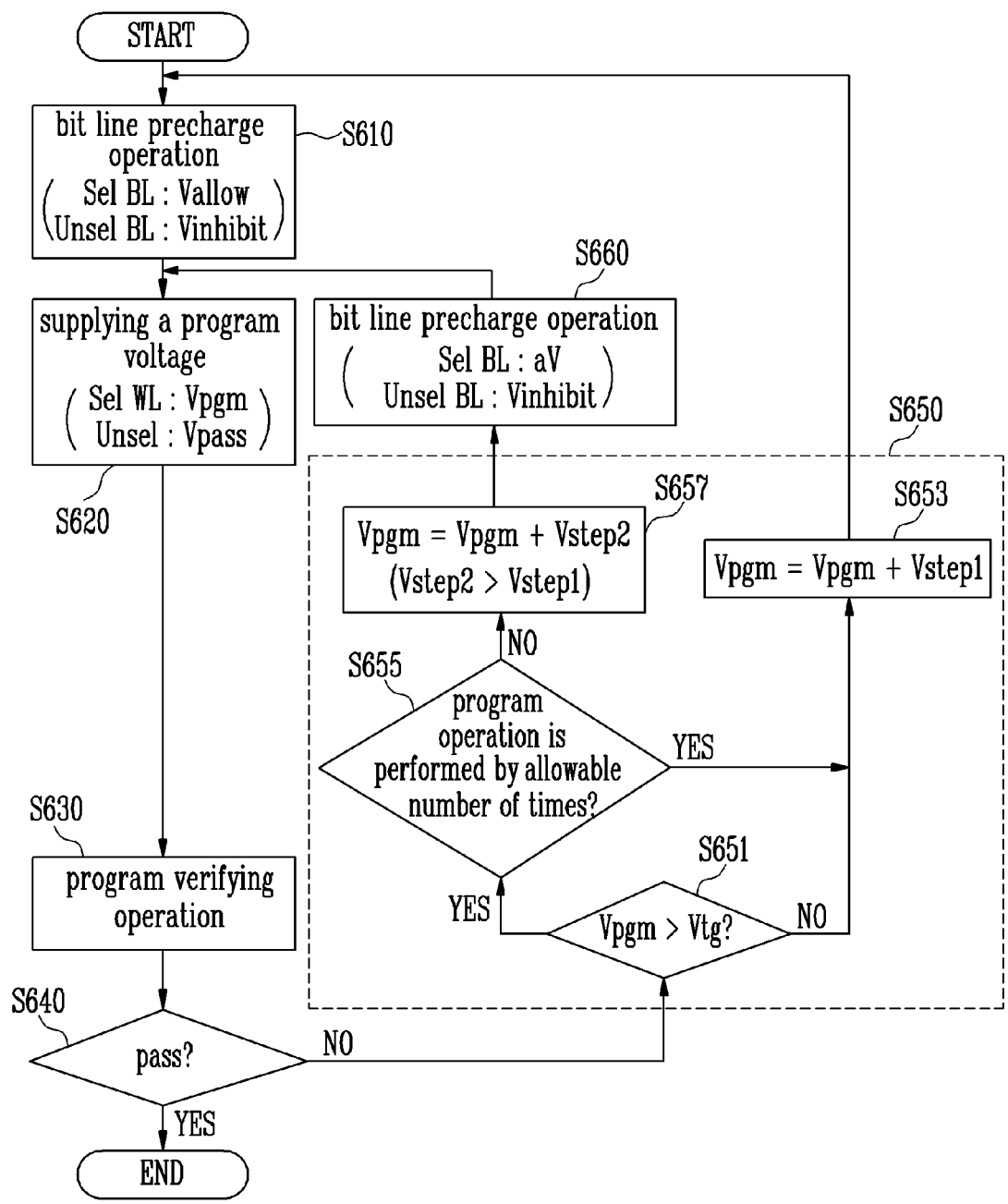

U.S. 9,082,488 B2

FLASH MEMORY DEVICE AND METHOD OF PROGRAMMING THE SAME

CROSS-REFERENCE TO RELATED APPLICATION

This application claims priority from Korean Patent Application No. 10-2012-0095644, filed on Aug. 30, 2012, which is herein incorporated by reference in its entirety.

BACKGROUND

The present invention relates to a semiconductor memory device including a memory cell and a method of operating the same.

As the size of memory arrays is reduced, the space between memory cells becomes smaller. Consequently, abnormal characteristics occur within the semiconductor memory device. For example, as a result of the proximity of neighboring cells, interference between adjoining memory cells can occur when a program operation for storing data in the memory cells is performed. As a result, errors occur and reliability of the semiconductor memory device can be deteriorated.

Accordingly, memories that minimize interference phenomenon between cells are needed.

SUMMARY OF THE INVENTION

Embodiments of the present invention provide a semiconductor memory device. A semiconductor memory device according to some embodiments of the present invention includes a memory block configured to include memory cells coupled to word lines and a peripheral circuit configured to perform a first program loop that includes a first program operation and a program verifying operation and a second program loop that includes a second program operation and the program verifying operation for memory cells coupled to a word line selected from the word lines, and supply program allowable voltages having different levels to selected bit lines of program allowable cells located between program inhibition cells during the first program loop and the second program loop.

A method of operating a semiconductor memory device according to some embodiments of the present invention includes operating a first program loop, the first program loop including performing a first program operation, the first program operation including supplying a program inhibition voltage to unselected bit lines of program inhibition cells, the program inhibition cells being memory cells coupled to a selected word line that are not selected, supplying a first program allowable voltage to selected bit lines of program allowable cells, the program allowable cells being memory cells coupled to the selected word line that are selected, and supplying a program voltage to the selected word line, and performing a program verifying operation for the memory cells; and operating a second program loop after the program voltage has exceeded a threshold voltage, the second program loop including performing a second program operation, the second program operation including supplying the program inhibition voltage to the unselected bit lines, supplying a second program allowable voltage to the selected bit lines, supplying the program voltage to the selected word line, and performing the program verification, wherein the second program allowable voltage is a voltage between the first program allowable voltage and the program inhibition voltage.

Some embodiments of a semiconductor memory device according to the present invention may enhance operation characteristics and reliability. These and other embodiments are further described below with respect to the following figures.

BRIEF DESCRIPTION OF THE DRAWINGS

The above and other features and advantages of the present invention will become readily apparent by reference to the following detailed description when considered in conjunction with the accompanying drawings.

FIG. 6 shows a flowchart illustrating a method of operating a semiconductor memory device according to some embodiments of the present invention.

DETAILED DESCRIPTION

Hereinafter, some embodiments of the present invention will be explained in more detail with reference to the accompanying drawings. Although some embodiments are described herein, it should be understood that numerous other modifications and embodiments can be devised by those skilled in the art that will fall within the spirit and scope of the principles of this disclosure.

Figure 1:
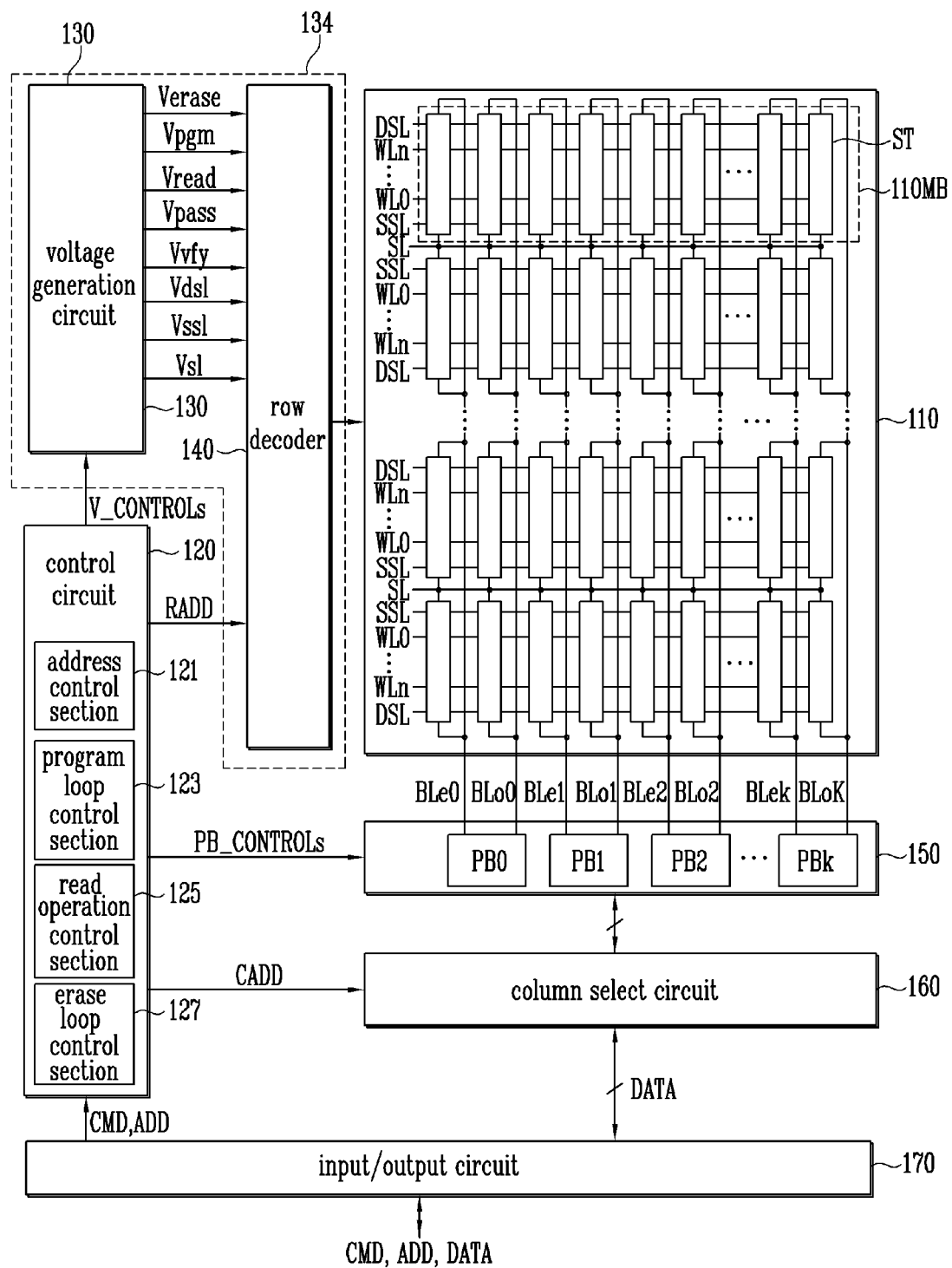
FIG. 1 illustrates a semiconductor memory device according to some embodiment of the present invention.
Figure 2:
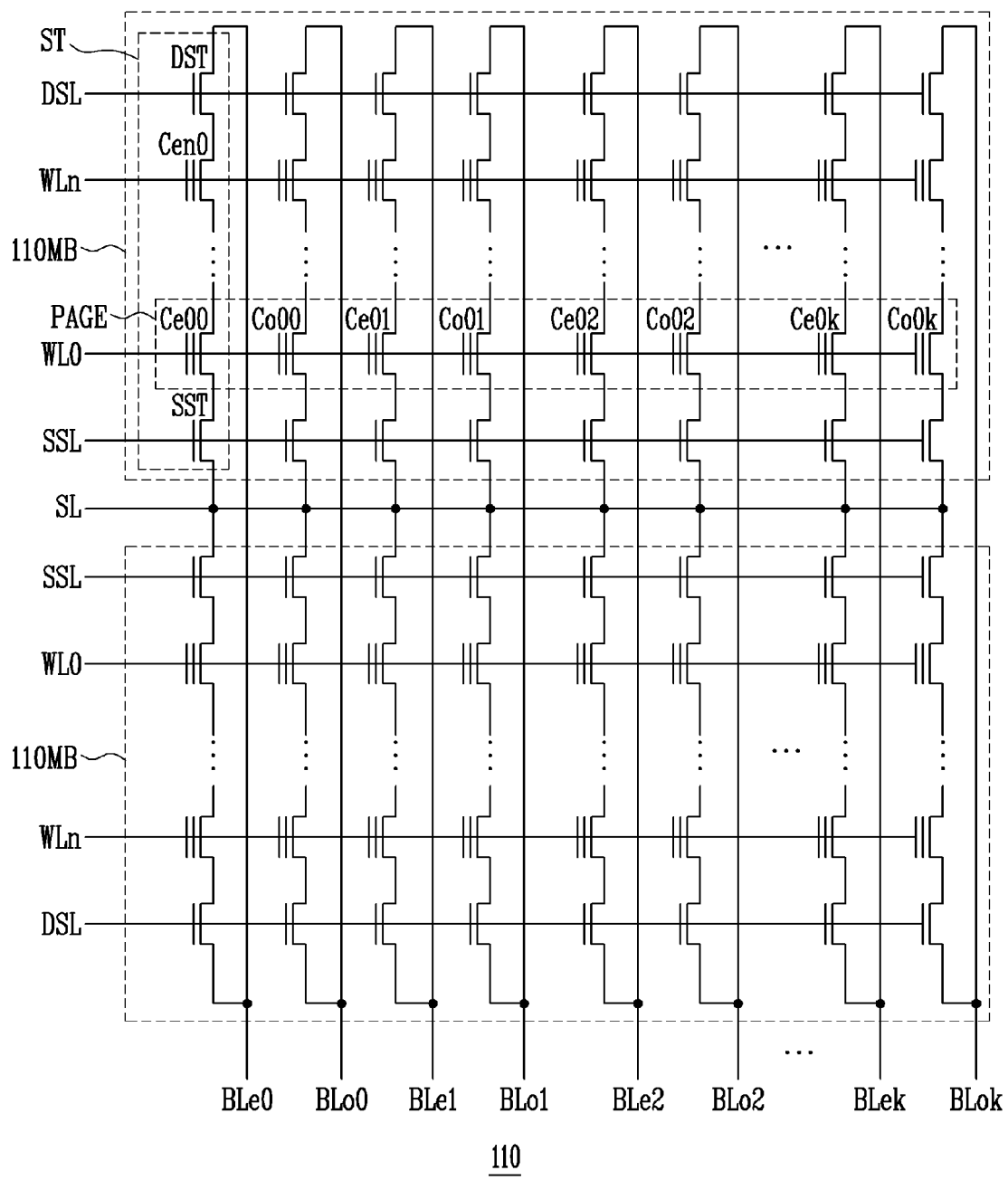
FIG. 2 illustrates a memory array of the semiconductor memory device illustrated in FIG. 1.

FIG. 1 illustrates a semiconductor memory device according to some embodiments of the present invention. FIG. 2 illustrates a memory array 110 as shown in FIG. 1.

In FIG. 1, the semiconductor memory device may include a memory array 110 and a peripheral circuit. The peripheral circuit may include a control circuit 120, and operation circuits. Operation circuits can include a voltage supply circuit 134, a page buffer group 150, a column select circuit 160 and an input/output circuit 170.

The memory array 110 includes memory blocks 110 MB. Each of the memory blocks 110 MB may include memory strings ST. The memory block 110 MB will be described with respect to FIG. 2.

In FIG. 2, each of the memory blocks includes the memory strings ST coupled between bit lines BLe0~BLek and BLo0~BLok and a common source line SL. That is, the memory strings ST are each respectively coupled to one of the corresponding bit lines BLe0~BLek and BLo0~BLok, and are coupled in common to the common source line SL. Each of the memory strings ST includes a source select transistor SST, a series coupled cell string, and a drain select transistor DST. As shown in FIG. 2, for example memory cells Ce00~Cen0 are coupled in series between a source select transistor SST and a drain select transistor DST. A source of the source select line SST is coupled to the common source line SL, and a drain of the drain select transistor DST is coupled to the bit line BLe0. A gate of the source select transistor SST is coupled to a source select line SSL, gates of the memory cells Ce00~Cen0 are respectively coupled to word lines WL0~WLn, respectively, and a gate of the drain select transistor DST is coupled to a drain select line DSL.

The drain select transistor DST controls coupling or blocking between the cell string Ce00~Cen0 and the bit line BLe0, and the source select transistor SST controls coupling or blocking between the cell string Ce00~Cen0 and the common source line SL.

Memory cells in a memory cell block of a NAND flash memory device may be divided into a physical page and a logical page. For example, the memory cells Ce00~Ce0$k$ and Co00~Co0$k$ are respectively coupled to one word line, e.g. WL0 and form one physical page PAGE. Additionally, even-numbered memory cells Ce00~Ce0$k$ coupled to one word line, e.g. WL0 may form one even physical page, and odd-numbered memory cells Co00~Co0$k$ may form one odd physical page. The page (even page or odd page) is then a reference unit of a program operation or a read operation.

Now referring to FIG. 1 and FIG. 2, the peripheral circuit, which includes control circuit 120, voltage supply circuit 134, page buffer group 150, column select circuit 160 and input/output circuit 170, performs an erase loop, a program loop and a read operation of the memory cells Ce00~Ce0$k$ and Co00~Co0$k$ that are coupled to a selected word line, e.g. WL0. Control circuit 120 controls the program loop, the read loop and the erase operation. Operation circuit, which includes voltage supply circuit 134, page buffer group 150, column select circuit 160 and input/output circuit 170, performs the program loop, the read loop and the erase operation. To perform the program loop, the read loop and the erase operation, the operation circuit (voltage supply circuit 134, page buffer group 150, column select circuit 160 and input/output circuit 170) outputs selective operation voltages such as Verase, Vpgm, Vread, Vpass, Vvfy, Vdsl, Vssl and Vsl to local lines SSL, WL0~WLn and DSL and the common source line SL of a selected memory block 110 MB. Operation circuit can also precharge or discharge the bit lines BLe0~BLek or BLo0~Blok, or sense voltage or current of the bit lines BLe0~BLek or BLo0~BLok. Elements of the NAND flash memory device operation circuit such as the voltage supplying circuit 134, the page buffer group 150, the column select circuit 160 and the input/output circuit 170 are described in further detail below.

Control circuit 120 outputs a voltage control signal V_CONTROLs for controlling the voltage supplying circuit 134 to generate the operation voltages Verase, Vpgm, Vread, Vpass, Vvfy, Vdsl, Vssl and Vsl for the program loop, the read operation or the erase loop with desired levels in response to a command signal CMD inputted from an external device through the input/output circuit 170. Control circuit 120 outputs PB control signals PB_CONTROLs for controlling page buffers PB0~PBk in the page buffer group 150 for performing the program loop, the read loop or the erase loop. Control circuit 120 generates a column address signal CADD and a row address signal RADD according to inputted address signal ADD. The signals CADD and RADD are outputted from the control circuit 120 to row decoder 140 and column select circuit 160, respectively.

The control circuit 120 may include an address control section 121, a program loop control section 123, a read operation control section 125 and an erase loop control section 127. The address control section 121 may generate the row address signal RADD and the column select signal CADD in response to the address signal ADD inputted through the input/output circuit 170. The program loop control section 123 controls operation of the program loop for storing data in the memory cells, and may generate the voltage control signal V_CONTROLs and the PB control signals PB_CONTROLs while the program loop is performed. The program loop includes a program operation and a program verifying operation, and may be performed through an increment step pulse program ISPP method. The read operation control section 125 controls a read operation of reading data from the memory cells, and may generate the voltage control signal V_CONTROLs and the PB control signals PB_CONTROLs while the read operation is performed. The erase loop control section 127 controls operation of the erase loop of erasing data stored in the memory cells, and may generate the voltage control signal V_CONTROLs and the PB control signals PB_CONTROLs while the erase loop is performed. The erase loop includes an erase operation and an erase verifying operation, and the erase loop may be performed through an increment step pulse erase ISPE method.

The voltage supplying circuit 134 generates the operation voltages Verase, Vpgm, Vread, Vpass, Vvfy, Vdsl, Vssl and Vsl for the program loop, the read operation or the erase loop of the memory cells in response to the voltage control signal V_CONTROLs of the control circuit 120. Voltage supply circuit 134 supplies the operation voltages to the local lines SSL, WL0~WLn and DSL and the common source line SL of the selected memory block 110 MB in response to the row address signal RADD generated by control circuit 120.

The voltage supplying circuit 134 may include a voltage generation circuit 130 and a row decoder 140. The voltage supplying circuit generates the operation voltages Verase, Vpgm, Vread, Vpass, Vvfy, Vdsl, Vssl and Vsl in response to the voltage control signal V_CONTROLs of the control circuit 120, and the row decoder 140 delivers the operation voltages to the local lines SSL, WL0~WLn and DSL and the common source line SL of the selected memory block of the memory blocks in response to the row address signal RADD generated by control circuit 120.

Output and change of the operation voltages Verase, Vpgm, Vread, Vpass, Vvfy, Vdsl, Vssl and Vsl are performed by the voltage supplying circuit 134 according to the voltage control signal V_CONTROLs generated by control circuit 120. As shown in FIG. 1, row decoder 140 provides the operation voltages to DSL, WL0-WLn, SL and SSL of a particular memory block 110 MB according to the row address signal RADD. As shown, Vsl is provided to SL, Vssl is provided to SSL, Vdsl is provided to DSL, and Verase, Vpgm, Vread, Vpass, and Vvfy are supplied to WL0-WLn as appropriate for a read operation, a program operation, or an erase operation.

In the event that the program operation is performed through the ISPP method, the voltage supplying circuit 134 increases a program voltage Vpgm by a step voltage on each iteration of the program loop. That is, a program operation is repeated if a number of memory cells having a threshold voltage lower than a target level is more than a preset number according to a program verifying operation performed after the program operation. In case that the program operation is performed again, the program voltage Vpgm is increased from the program voltage Vpgm that was supplied during the prior program operation by the step voltage.

In some embodiments, the voltage supplying circuit 134 may increase the program voltage Vpgm by a higher step voltage if the program operation is performed again within a specific time interval. This will be described in further detail below.

Each of the page buffer groups 150 includes page buffers PB0~PBk coupled to the memory array 110 through the bit lines BLe0~BLek and BLo0~BLok. The page buffers PB0~PBk precharge selectively the bit lines BLe0~BLek and BLo0~BLok according to the PB control signal PB_CONTROLs of the control circuit 120 and data DATA to be stored in the memory cells during performance of the program operation. The page buffers PB0~PBk latch data read from the memory cell by sensing voltage change or current of the bit lines BLe0~BLek or BLo0~BLok after precharging the bit lines BLe0~BLek or BLo0~BLok, in response to the PB control signal PB_CONTROLs of the control circuit 120 when the program verifying operation or the read operation is performed. The page buffer 150 will be described in further detail below.

Figure 3:
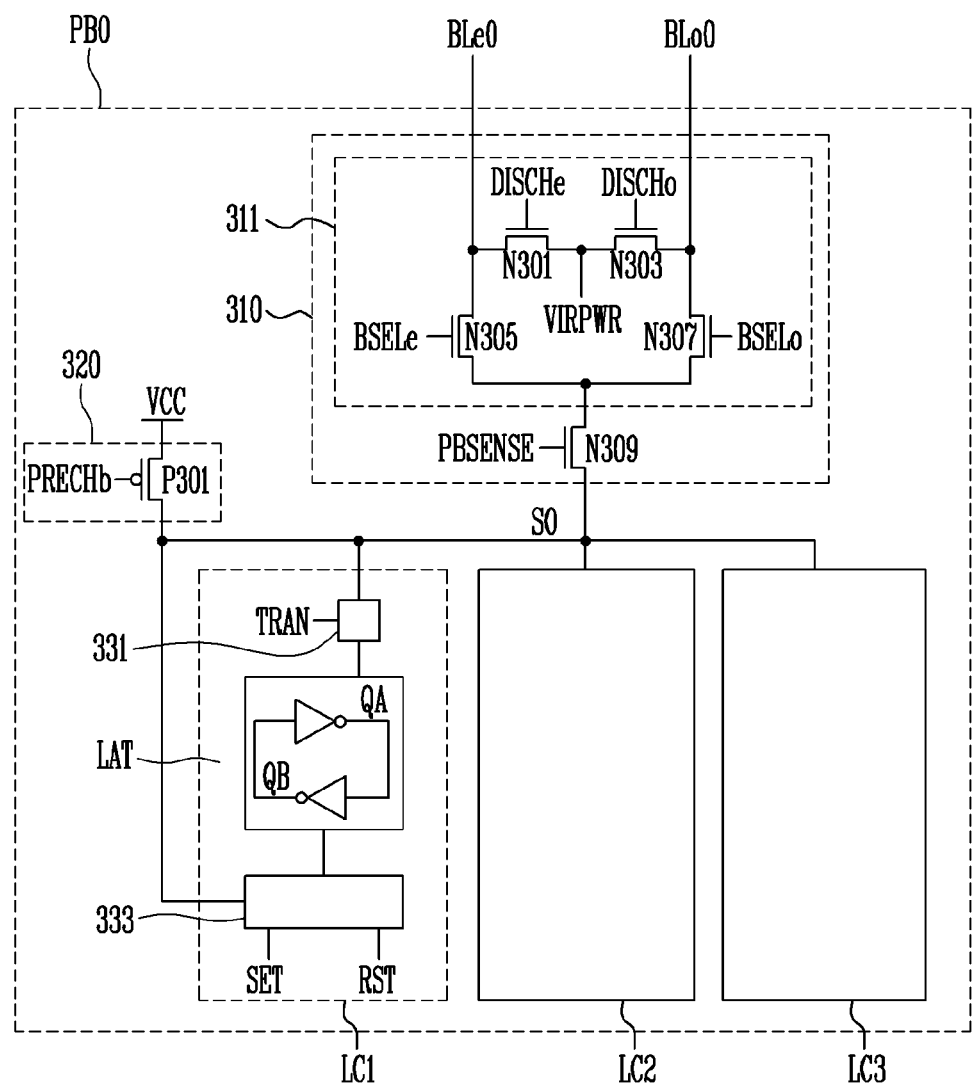
FIG. 3 illustrates a page buffer of the semiconductor memory device illustrated in FIG. 1 according with some embodiments of the present invention.

FIG. 3 illustrates a page buffer, PB0 as shown in FIG. 1 as an example, according to one embodiment of the present invention. As shown in FIG. 1, page buffer PB0 operates according to control signals PB_Controls from f control circuit 120. As illustrated in FIG. 3, control signals PB_Controls can include the following signals: PRECHb, TRAN, PBSENSE, BSELe, BSELo, DISCHe and DISCHo. The page buffer PB0 may include a bit line couple circuit 310, a precharge circuit 320 and latch circuits LC1~LC3.

The bit line couple circuit 310 may include a bit line select circuit 311 and a couple element N309. The bit line select circuit 311 in selects between a pair of bit lines, for example BLe0 and BLo0 as shown in FIG. 3, and may be omitted in the event that the page buffer PB0 is coupled to a single bit line. In the event that the bit line select circuit 311 is omitted, the couple element N309 may function as the bit line couple circuit.

Switching elements N305 and N307 of the bit line select circuit 311 select one of an even bit line BLe0 and an odd bit line BLo0 in response to bit line select signals BSELe and BSEL0. Switching elements N301 and N303 precharge a bit line not selected in the program operation or discharges the bit line not selected in the read operation in response to discharge signals DISCHe and DISCHo.

The coupling element N309 couples a bit line selected by the bit line select circuit 311 to latch circuits LC1~LC3 in response to a couple signal PBSENSE. The latch circuits LC1~LC3 are coupled in parallel to the couple element N309. A coupling node between the couple element N309 and the latch circuits LC1~LC3 is a sensing node SO. Sensing node S0 can be precharged by precharge circuit P301 in response to a precharge signal PRECHb.

The number of the latch circuits LC1~LC3 may be modified according to their design. For illustrative purposes only, the page buffer PB0 illustrated in FIG. 3 includes three latch circuits LC1~LC3. Latch circuits LC1~LC3 are selectively activated. The first latch circuit LC1 may store temporarily data inputted from column select circuit 160 (FIG. 1) and deliver the inputted data to the second latch circuit LC2, or store temporarily data read from the memory cell during a read operation, the read data being provided to the column select circuit 160 from the latch circuit LC1. The second latch circuit LC2 may supply a program inhibition voltage or a program allowable voltage to the bit line according to the data delivered from the first latch circuit LC1 when the program operation is performed. The second latch circuit LC2 may store temporarily data stored in the memory cell in response to a voltage of the bit line when the read operation is performed, and deliver the stored data to the first latch circuit LC1. The third latch circuit LC3 may latch comparison result of threshold voltage of the memory cell and a target voltage in a verifying operation performed after the program operation, and output a comparison signal (not shown) in accordance with the comparison result.

Each of the latch circuits L1, L2, and L3 may include switching elements and a latch. Hereinafter, operation of the latch circuits will be described with respect to the first latch circuit LC1. The first latch circuit LC1 may include a transmission circuit 331, a latch LAT and a latch control circuit 333. The latch LAT latches data. The transmission circuit 331 couples a first node, non-inversion terminal QA, of the latch LAT to the sensing node SO so that the data in the latch LAT is transmitted to the sensing node SO according to a transmission signal TRAN. The latch control circuit 333 is respectively coupled to non-inversion terminal QA and inversion terminal QB of the latch LAT, and operates in response to a set signal SET, a reset signal RST and the potential of the sensing node SO. The latch control circuit 333 stores data inputted from an external device into the latch LAT in the program operation, or stores data representing verifying result in the latch LAT in a read operation or a verifying operation. An inversion signal and a non-inversion signal of data may be used as the set signal SET and the reset signal RST so that the data inputted from the external device, e.g. from input/output circuit 170 through column select circuit 160, is stored in the latch LAT of LC1 in the program operation.

Since signals having different waveform are inputted to the latch circuit LC2 and LC3, only one of latch circuits LC1, LC2, and LC3 may be activated at any one time. Although latch circuits LC2 and LC3 have substantially the same structure as illustrated for first latch circuit LC1, latch circuits LC2 and LC3 may perform different functions as described above.

The page buffer, such as PB0 shown in FIG. 3, divides the memory cells into program inhibition cells where data '1' is stored and program allowable cells where data '0' is stored. The data in program inhibition cells and program allowable cells is according to the data inputted from the external device and is stored in the memory cells during the program operation. The page buffer supplies the program allowable voltage, e.g. 0V to the bit line (BLe0 or Blo0 in FIG. 3) when the memory cell is the program allowable cell, and supplies the program inhibition voltage, e.g. Vcc to the bit line when the memory cell is the program inhibition cell. Accordingly, bit lines Ble0 and BLo0 may be discharged by the program allowable voltage or be precharged by the program inhibition voltage.

In some embodiments, a program allowable voltage higher than 0V may be supplied to the bit line by the page buffer when a particular memory cell is the program allowable cell. This allows for the cell to perform smoothly with a channel boosting that prevents the threshold voltage of the program inhibition cell from being increased in a channel area of the program inhibition cell. This feature is further described below.

Now referring to FIG. 1, the column select circuit 160 selects the page buffers PB0~PBk in the page buffer group 150 in response to the column address CADD outputted from the control circuit 120. That is, during a program operation the column select circuit 160 delivers the data to be stored in the memory cells in sequence to the page buffers PB0~PBk in response to the column address CADD. In a read operation, the column select circuit 160 selects the page buffers PB0~PBk in sequence in response to the column address CADD so that the data of the memory cells latched in the page buffers PB0~PBk by the read operation is outputted to an external device.

The input/output circuit 170 delivers the command signal CMD and the address signal ADD inputted from an external device coupled to the input/output circuit 170 to the control circuit 120. The input/output circuit 170 delivers the data DATA inputted from the external device to the column select circuit 160 in the program operation, or outputs the data read from the memory cells to the external device in the read operation.

Figure 4:
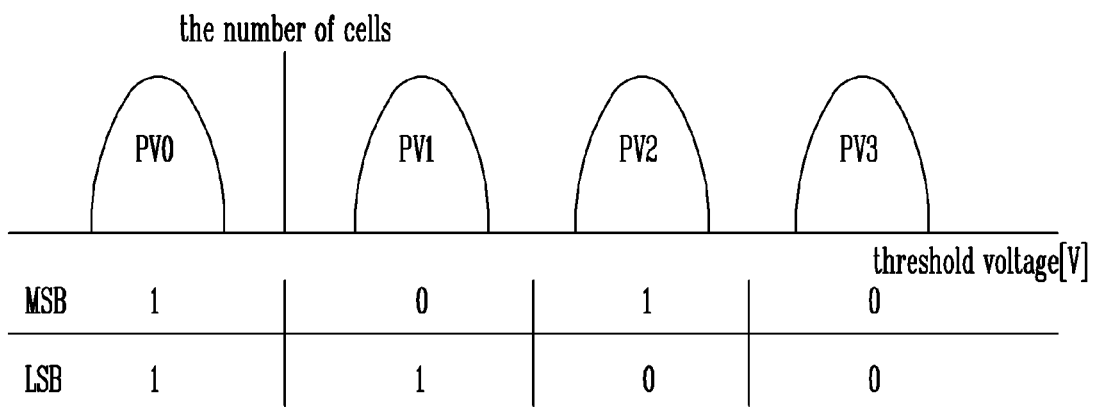
FIG. 4 illustrates a threshold voltage distribution of data stored in the memory cells of the memory array illustrated in FIG. 2.

FIG. 4 illustrates a threshold voltage distribution in accordance with data stored in the memory cells. In FIG. 4, in a program operation for programming a multi level cell, which stores data of two bits (LSB data and MSB data), threshold voltage distributions of the memory cells are divided into four levels labeled PV0~PV3. The particular threshold distribution programmed into the cell represents the data stored in the memory cells. For example, threshold voltages of memory cells for storing data '11' may be distributed in an erase level PV0, threshold voltages of memory cells for storing data '01' may be distributed in a first program level PV1, threshold voltages of memory cells for storing data '10' may be distributed in a second program level PV2, and threshold voltages of memory cells for storing data '00' may be distributed in a third program level PV3.

In the event that an LSB program operation of storing the LSB data is completed, threshold voltages of memory cells may be distributed in two different levels. For example, threshold voltages of memory cells for storing LSB data '1' are distributed in the erase level PV0, and threshold voltages of memory cells for storing LSB data '0' increase up to a level higher than 0V. Subsequently, in the event that an MSB program operation for storing the MSB data is completed, the threshold voltages of the memory cells are distributed in four levels PV0~PV3 according to the LSB data and the MSB data. In other words, during programming the memory cell starts in the erase state PV0. The threshold level is shifted to state PF2 of if the LSB is "0". Further, the threshold level is shifted up in voltage if MSB is "0". Therefore, in the two-step programming function the LSB bit is programmed first and then the MSB is programmed, both by shifting the threshold voltage upwards if the bit being programmed is a "0" and not shifting the threshold voltage if the bit being programmed is a "1". One skilled in the art will recognize that other programming procedures can also be utilized.

Figure 5A:
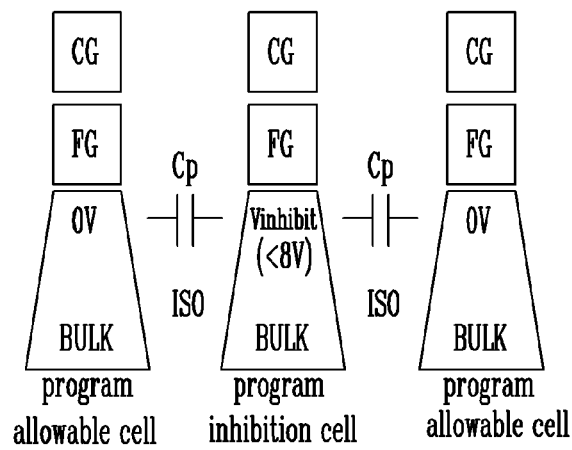
FIG. 5A and FIG. 5B illustrate a method of operating a semiconductor memory device according to some embodiments of the present invention.
Figure 5B:
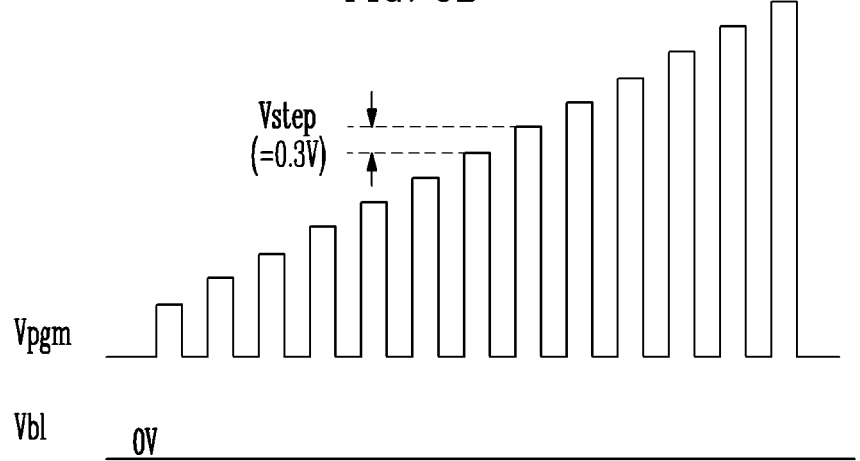

Hereinafter, a method of operating a semiconductor memory device including the above elements will be described in detail. FIG. 5a and FIG. 5b help illustrate a method of operating a semiconductor memory device according to some embodiments of the present invention.

In FIG. 2, FIG. 5a and FIG. 5b, memory cells coupled to a selected word line are divided into program inhibition cells and program allowable cells according to data stored in the memory cells as described above. FIG. 5A illustrates three cells in a row of memory cells connected to a particular word line. As shown in FIG. 5A, each cell includes a control gate (CG) that is coupled to the particular word line, a floating gate (FG), and a bulk region. The channel region with source and drain is between the bulk region and the floating gate (FG). Bit lines BLe and BLo and source line (SL) are coupled across the channel regions as illustrated in FIG. 2.

As described above, the memory cell where a data '1' is to be programmed is a program inhibition cell and the memory cell where a data '0' is to be programmed is a program allowable cell. The program allowable cell, where the threshold voltage is increased up to a voltage more than the target level, becomes a program inhibition cell. Memory cells included in an odd page (i.e. coupled to one of bit lines BLo) may become the program inhibition cell when a program operation for an even page is performed, and memory cells included in the even page (i.e. coupled to one of bit lines BLe) may become the program inhibition cell when a program operation for the odd page is performed. The threshold voltage of the program inhibition cell is not changed in the program operation though a program voltage is supplied. However, the threshold voltage of the program allowable cell increases by the program voltage supplied in the program operation.

To prevent the threshold voltage of the program inhibition cell from being changed when the program voltage is supplied to the control gate, a program inhibition voltage Vinhibit is supplied to a bit line of the program inhibition cell. In the event that the drain select transistor DST is turned on, the program inhibition voltage is supplied to a channel area in the string ST, and a channel area BULK of the memory cells is precharged by the program inhibition voltage. Additionally, a program allowable voltage, e.g. 0V is supplied to a selected bit line of the program allowable cell. In the event that the drain select transistor DST is turned on, the channel area in the string ST is discharged through the selected bit line.

A pass voltage is supplied to word lines not selected, and the program voltage Vpgm is supplied to a selected word line. A channel voltage of the channel area of the program inhibition cell increases according to channel boosting due to the pass voltage supplied to the word line at the control gate (CG). As a result, the difference between the program voltage supplied to the program inhibition cell and the increased channel voltage is small. This small increased channel voltage is not intended to alter the threshold voltage of the program inhibition cell.

However, capacitive coupling between the program allowable cell and the program inhibition cell may result in increasing the threshold voltage of the program inhibition cell as well. An element isolation layer ISO is formed between bulks BULK of neighboring cells. Therefore, a parasite capacitor Cp is formed between channel areas of adjoining memory cells. Accordingly, the channel voltage in the program allowable cells may not be increased to the target level though the channel boosting occurs, and conversely the channel voltage in program inhibition cells may be unintentionally increased. For example, in the event that the program allowable cells locate at both sides of the program inhibition cell, the channel areas of the program allowable cells are discharged. As a result, the channel voltage of the program allowable cell may not increase to the target level due to coupling phenomenon and the channel voltage of the program inhibition cell may be increased by the channel boosting.

Accordingly, since the difference of the program voltage Vpgm supplied to the program inhibition cell and the channel voltage of the program inhibition cell gets higher, the threshold voltage of the program inhibition cell may increase as well. Especially since the program voltage Vpgm increases by a step voltage Vstep whenever the program operation is performed again in the program operation using an ISPP method, as is illustrated in FIG. 5B, the difference of the program voltage Vpgm and the channel voltage augments as the program voltage Vpgm increases, and the threshold voltage of the program inhibition cell gets higher and the threshold voltage of the program allowable cell does not shift as much as was intended. Consequently, error may occur in the programming due to the above interference phenomenon.

Figure 7A:
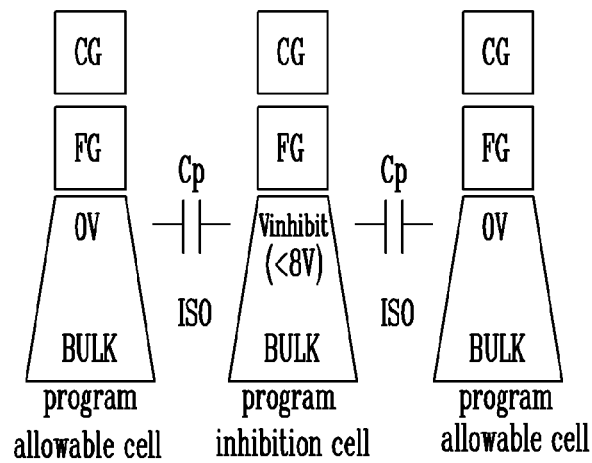
FIG. 7A and FIG. 7B illustrate operation of a semiconductor memory device according to some embodiments of the present invention.
Figure 7B:
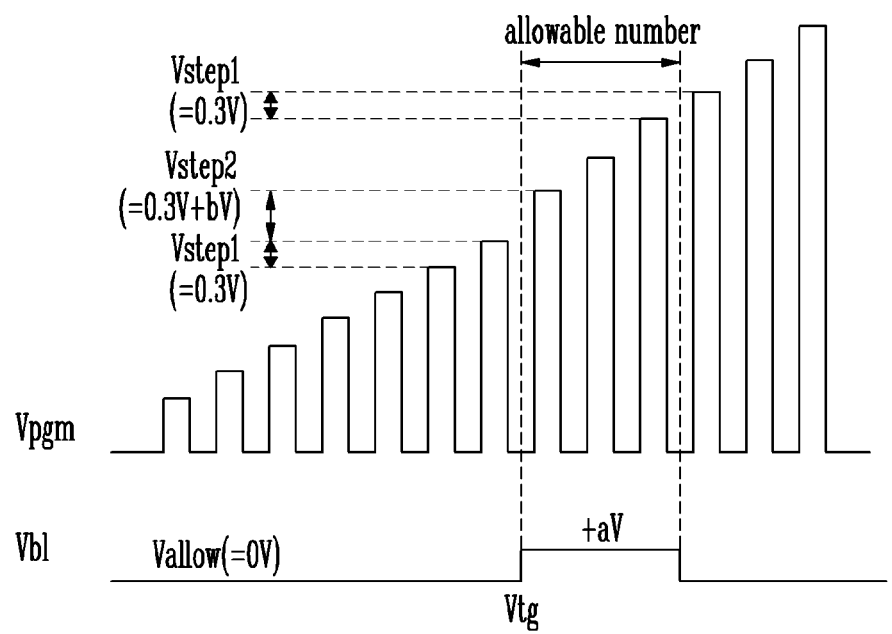

Accordingly, some embodiments of the present invention provide a method of minimizing this interference phenomenon. FIG. 6 shows a flowchart illustrating a method of operating a semiconductor memory device according to some embodiments of the present invention. FIG. 7a and FIG. 7B are views illustrating operation of a semiconductor memory device according to some embodiments of the present invention.

The peripheral circuit (including controller 120, voltage supply circuit 134 and page buffer 150) perform the program operation illustrated in FIG. 6. FIG. 7a illustrates the memory cells designated as program allowable cells and program inhibition cells, with the parasitic capacitance between bulk regions of the cells is shown. FIG. 7b illustrates the voltage levels Vpgm and Vbl during execution of the program operation illustrated in FIG. 6.

As shown in FIG. 6, in bit line precharge operation 610 the selected bit line is set to Vallow and the unselected bit lines are set to Vinhibit. In step program voltage step S620, the selected word line is set to Vpgm and the unselected word lines are set to Vpass. In step 630, a program verifying operation is performed. The program verifying operation reads the programmed cells to determine whether the selected cells are appropriately programmed. In step S640, if the program verification passed then the programming step is completed and ends. If not, then in step S651, Vpgm is compared with a reference voltage Vtg. If Vpgm>Vtg then in step S655 a check is performed to see if the program operation has been performed an allowable number of times. If no, then Vpgm is increased by an amount Vstep2 in step S657. In step S660, the selected bit line is set to a value aV and the unselected bitline is set to Vinhibit. From step S660, step S620 is then performed. If in step S651 if Vpgm is less than a reference voltage Vtg or in step S655 if the program operation has been performed an allowable number of times, then in step S653 Vpgm is increased by a value Vstep1 and step S610 is performed again.

As shown in FIG. 6 and illustrated in FIGS. 7A and 7B, a first program operation S610 and S620, a program verifying operation S630 and a second program operation S660 and S620 can be executed. The peripheral circuit (including control circuit 120, voltage supply circuit 134 and page buffer group 150) performs a program voltage setting operation S650 when the program operation is performed again. The level of a program allowable voltage Vallow or aV supplied to a selected bit line of the program allowable cell in the first program operation S610 and S620 may be different from that in the second program operation S660 and S620.

In the event that it is detected that the number of memory cells where the threshold voltage does not increase to the target level, is higher than an allowable number according to the program verifying operation, the peripheral circuit (including control circuit 120, voltage supply circuit 134 and page buffer group 150) performs repetitively the first program operation steps S610 and S620 and the program verifying operation step S630 or performs repetitively the second program operation steps S660 and S620 and the program verifying operation step S630 according to the level of the program voltage Vpgm. For example, the peripheral circuit (including control circuit 120, voltage supply circuit 134 and page buffer group 150) performs repetitively the first program operation steps S610 and S620 and the program verifying operation step S630 in the event that the program voltage Vpgm is lower than a reference voltage Vtg, and performs repetitively the second program operation steps S660 and S620 and the program verifying operation step S630 in the event that the program voltage Vpgm is higher than the reference voltage Vtg. The first program operation steps S610 and S620 and the program verifying operation step S630 may be included in a first program loop, and the second program operation steps S660 and S620 and the program verifying operation step S630 may be included in a second program loop.

The peripheral circuit (including control circuit 120, voltage supply circuit 134 and page buffer group 150) may perform repetitively the first program loop steps S610, S620 and S630 in an operation of storing LSB data in the memory cells, and perform repetitively the second program loop steps S660, S650, S620 and S630 in an operation of storing MSB data in the memory cells. The peripheral circuit (including control circuit 120, voltage supply circuit 134 and page buffer group 150) may perform repetitively the second program loop steps S660, S620 and S630 in an operating of increasing the threshold voltage of the memory cell to highest third program level. The peripheral circuit (including control circuit 120, voltage supply circuit 134 and page buffer group 150) may perform repetitively the first program loop after the second program loop steps S660, S620 and S630 is repetitively performed by an allowable number of times.

The peripheral circuit (including control circuit 120, voltage supply circuit 134 and page buffer group 150) may set differently increasing values of the program voltage Vpgm when the first program loop steps S610, S620 and S630 are performed repetitively and increase the step value when the second program loop steps S660, 5620 and 5630 are performed repetitively. For example, the increase value (Vstep2) when the second program loop steps S660, S620 and S630 are performed repetitively may be higher than the increase value (Vstep1) of the program voltage Vpgm when the first program loop steps S610, 5620 and 5630 are performed repetitively.

In the step S610, a bit line precharge operation is performed by the peripheral circuit (including control circuit 120, voltage supply circuit 134 and page buffer group 150). The program allowable voltage Vallow is supplied to the selected bit lines (bit lines to the program allowable cells) and the program inhibition voltage Vinhibit is supplied to unselected bit lines (bit lines to the program inhibition cells). Here, the program allowable voltage Vallow includes can, for example, be a ground voltage. The drain select transistor DST may be turned on, the source select transistor SST may be turned off a supply voltage may be supplied to the common source line SL. As a result, the channel area of the program inhibition cell is precharged by the program inhibition voltage Vinhibit, and the channel area of the program allowable cell is discharged.

In the step S620, the pass voltage Vpass is supplied to word lines not selected by the peripheral circuit (including control circuit 120, voltage supply circuit 134 and page buffer group 150), and the program voltage Vpgm is supplied to a selected word line. As a result, the threshold voltage of the program allowable cells increases.

In the step S630, the program verifying operation is performed by the peripheral circuit (including control circuit 120, voltage supply circuit 134 and page buffer group 150). Since the program verifying operation is a well-known operation, further description concerning the program verifying operation will be omitted.

In step S640, it is detected through the program verifying operation whether the number of memory cells where the threshold voltage does not increase to the target level, according to the data latched in the page buffers PB0~PBk, is higher than the allowable number. In the event that the number of the memory cells is less than the allowable number, the program operation is completed. If the number of the memory cells is higher than the allowable number, the program operation is performed again.

In the step S650, the peripheral circuit (including control circuit 120, voltage supply circuit 134 and page buffer 150) performs the program voltage setting operation before the program operation is performed again. That is, the peripheral circuit (including control circuit 120, voltage supply circuit 134 and page buffer 150) determines whether the program voltage Vpgm will increase by a first step voltage Vstep1 or increase by a second step voltage Vstep1, which may be higher than the first step voltage Vstep1. Particularly, the peripheral circuit (including control circuit 120, voltage supply circuit 134 and page buffer 150) detects whether the program voltage Vpgm is higher than a reference voltage Vtg in step S651. The program voltage Vpgm is increased by the first step voltage Vstep1 in the event that the program voltage Vpgm is lower than the reference voltage Vtg in step S653. The peripheral circuit (including control circuit 120, voltage supply circuit 134 and page buffer 150) then perform again the first program loop steps S610, S620 and S630.

The peripheral circuit (including control circuit 120, voltage supply circuit 134 and page buffer group 150) detects that the program voltage Vpgm is higher than the reference voltage Vtg in step S651 and detects whether the second program loop steps S660, S620 and S630 have been performed by the allowable number of times or more in step S655. In the event that the second program loop steps S660, S620 and S630 have not been performed the allowable number of times, the peripheral circuit (including control circuit 120, voltage supply circuit 134 and page buffer group 150) increases the program voltage Vpgm by the second step voltage Vstep2, which may be higher than the first step voltage Vstep1 used in step S657.

Subsequently, the peripheral circuit (including control circuit 120, voltage supply circuit 134 and page buffer group 150) performs the second program loop steps S660, S620 and S630. The second program loop (steps S660, S620 and S630) is different from the first program loop (steps S610, S620 and S630) in that a second program allowable voltage aV, which can be higher than the first program allowable voltage Vallow and lower than the program inhibition voltage Vinhibit, is supplied to the selected bit lines of the program allowable cells. The increased value of the program voltage Vpgm when the second program loop steps S660, S620 and S630 are performed repetitively is higher than that when the first program loop steps S610, S620 and S630 are performed repetitively.

The second program loop steps S660, S620 and S630 reduces capacitance of the parasite capacitor Cp by supplying the second program allowable voltage aV to the bit lines not selected, and thus it may increase adequately the channel voltage of the program inhibition cell. As a result, difference of the program voltage supplied to the program inhibition cell and the channel voltage may become reduced, resulting in the threshold voltage of the program inhibition cell being prevented from being changed or increased.

As is further illustrated in FIG. 7b, the difference between the program voltage Vpgm and the channel voltage of the program allowable cell is reduced as the second program allowable voltage aV, which can be a positive voltage, is supplied to the channel area of the program allowable cell. Therefore, the increased value of the threshold voltage of the program allowable cell may also be reduced. As a result, program operation speed may be slowed. The program voltage Vpgm increases by the second step voltage Vstep2, which is higher than the first step voltage Vstep1 as shown in FIG. 7b, in step 657 to compensate the program operation speed. Accordingly, the difference of the program voltage Vpgm and the channel voltage of the program allowable cell may be adequately maintained, and the program operation speed may be prevented from being reduced.

Stress applied to the memory cells gets higher if the program voltage increases continuously by high value. Accordingly, in the event that it is determined that the iteration number of the second program loop steps S660, S620 and S630 exceeds the allowable number in the step S655, the peripheral circuit (including control circuit 120, voltage supply circuit 134 and page buffer 150) again increases the program voltage Vpgm by the first step voltage Vstep1, and performs repetitively the first program loop steps S610, 620 and S630.

An example of the voltages utilized in the programming sequence illustrated in FIG. 6 is illustrated in FIG. 7B. As shown, Vpgm is increased stepwise by step voltage Vstep1 and Vbl is set to Vallow until Vpgm exceeds Vtg. For an allowable number of steps, Vpgm is then increased stepwise by step voltage Vstep2 and Vbl is set to aV. After the allowable number of steps, Vpgm is increased stepwise by step voltage Vstep1 and Vbl is set to Vallow.

In some embodiments, the first program allowable voltage Vallow may be set in the range of 0V to 0.5V, and may be set to 0V as illustrated in FIG. 7b. The second program allowable voltage aV may be set to between about 1V to about 2V. The program voltage Vpgm may increase from about 14V to about 21V, the first step voltage Vstep1 may be set in the range of 0.1V to 0.4V, and the second step voltage Vstep2 may be set in the range of 0.4V to 1.0V. In some embodiments, the program allowable voltages may be set by the page buffer group 150 and the program voltage may be set by the voltage supplying circuit 134.

As described above, the program voltage increases by the second step voltage Vstep2 when the program operation is performed repetitively while supplying the second program allowable voltage aV having positive voltage to the selected bit line of the program allowable cells. That is, the program voltage increases by the second step voltage whenever the second program loop is performed repetitively. The second program loop may be performed repetitively in whole or part of the operation of storing the MSB data, and be performed repetitively in whole or part of the operation of increasing the threshold voltage to the highest third program level.

Consequently, operation characteristics and reliability of the semiconductor memory device may be enhanced by storing the data in the memory cells through the above device and method.

Figure 8:
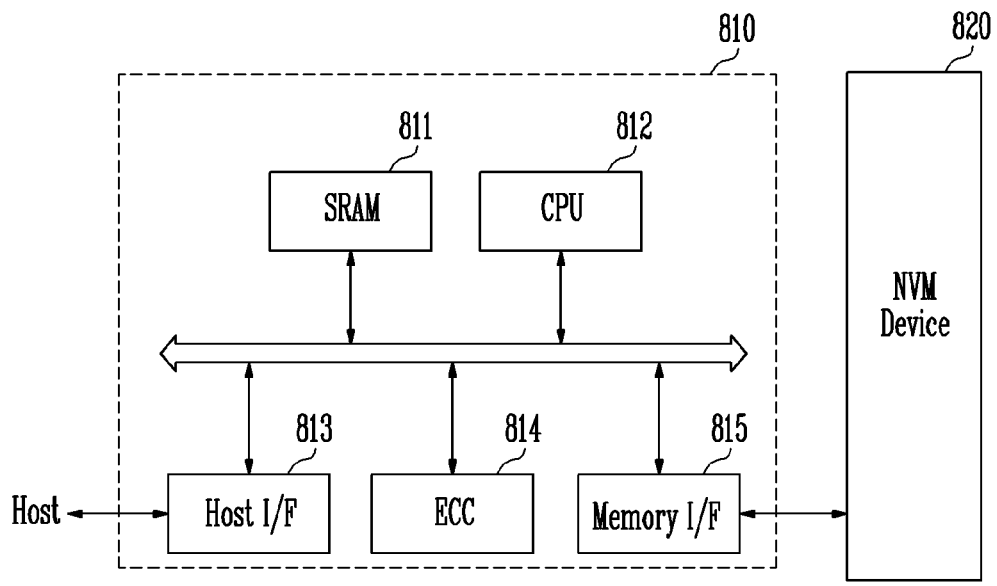
FIG. 8 shows a block diagram illustrating schematically a memory system according to some embodiments of the present invention.

FIG. 8 is a block diagram illustrating schematically a memory system according to some embodiments of the present invention. In FIG. 8, the memory system 800 may include a non-volatile memory device 820 and a memory controller 810. The non-volatile memory device 820 may be a semiconductor memory device as illustrated in FIG. 1 and FIG. 2 as described above. The memory controller 810 controls the non-volatile memory device 820. The memory system 800 may be used as a memory card or a solid state disk SSD by combination of the non-volatile memory device 820 and the memory controller 810. As shown in FIG. 8, an SRAM 811 can be used as an operation memory of a processing unit 812. A host interface 813 can have data exchange protocols for a host to accessed memory system 800. An error correction block 814 detects and corrects error of data read from the non-volatile memory device 820. A memory interface 814 interfaces with the non-volatile memory device 820 of the present invention. The processing unit 812 can perform control operation for data exchange of the memory controller 810.

The memory system 800 of the present invention may further include a ROM (not shown) for storing code data for interfacing with the host and performing other functions. The non-volatile memory device 820 may be provided as multi-chip package including flash memory chips. The memory system 800 of the present invention may be provided as high-reliable storage medium having low error rates. In some embodiments, the memory controller 810 can communicates with an outside device, e.g. host, through one of various interface protocols such as USB, MMC, PCI-E, SATA, PATA, SCSI, ESDI, IDE, for example.

Figure 9:
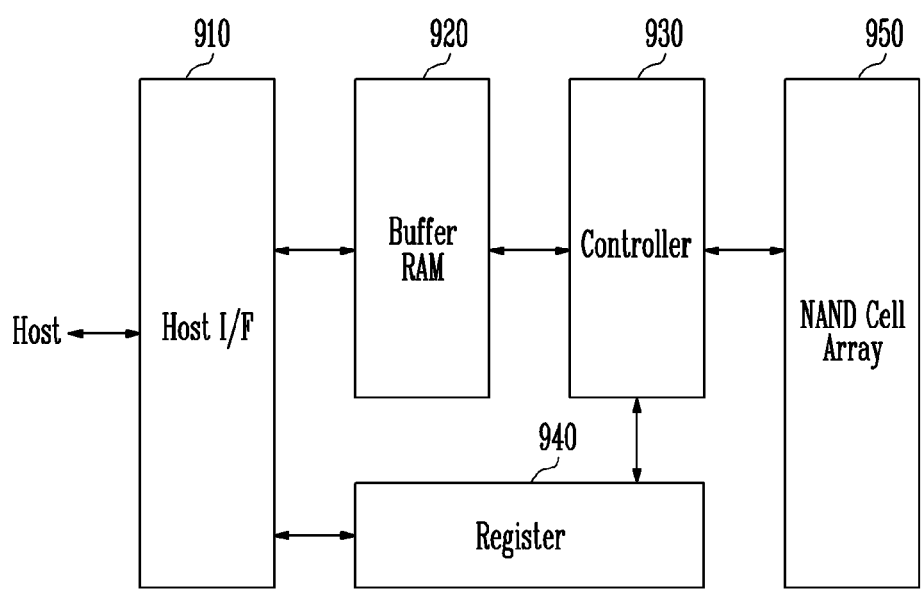
FIG. 9 shows a block diagram illustrating schematically a fusion memory device or a fusion memory system for performing a program operation according to some embodiments.

FIG. 9 illustrates schematically a fusion memory device or a fusion memory system 900 for performing a program operation according to some embodiments as described above. For example, features of the present invention may be applied to an OneNAND flash memory device 900 as a fusion memory device.

The OneNAND flash memory device 900 includes a host interface 910 for exchanging information with a device using different protocol, a buffer RAM 920 for embedding code for driving the memory device or storing temporarily data, a controller 930 for controlling reading, programming and every state in response to a control signal and a command inputted from an outside device, a register 940 for storing data such as configuration data for defining command, address, system operation environment in the memory device, and a NAND flash cell array 950 having operation circuit including a non-volatile memory cell and a page buffer. A memory array of the NAND flash cell array 950 may be similar to the memory array 110 illustrated in FIG. 2.

Figure 10:
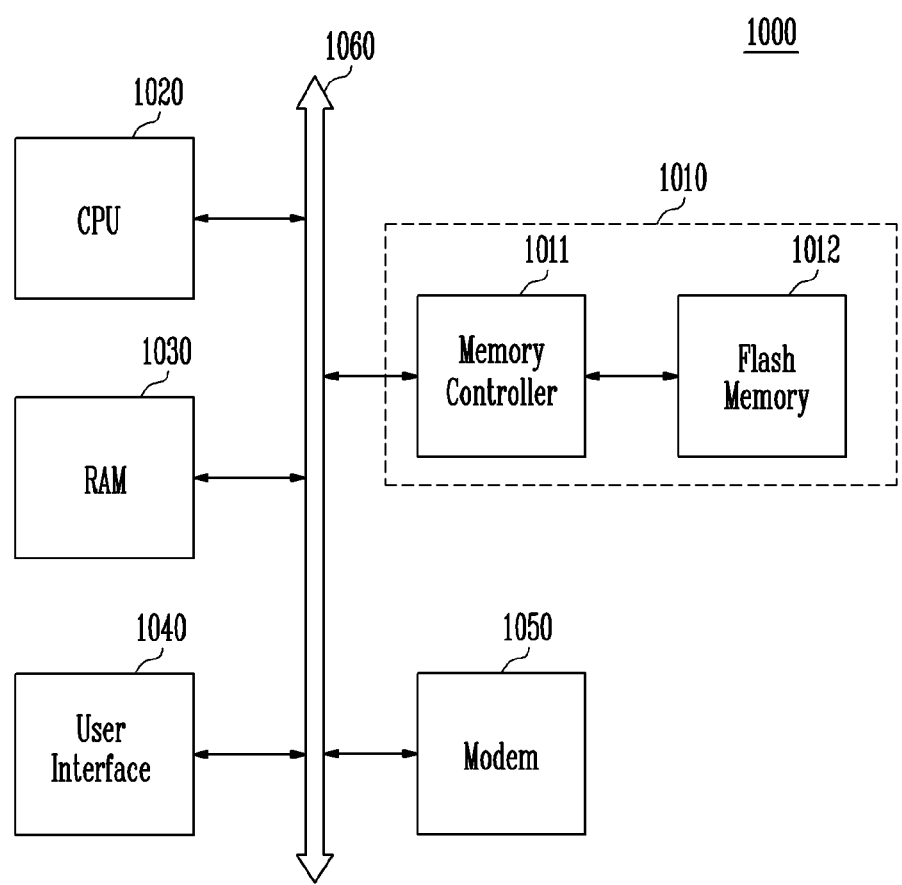
FIG. 10 illustrates schematically a computing system including a flash memory device according to some embodiments of the present invention.

FIG. 10 illustrates schematically a computing system 1000 including a flash memory device 1010 according to embodiments of the present invention. The computing system 1000 includes a microprocessor 1020 connected electrically to a system bus 1060, a RAM 1030, an user interface 1040, a modem 1050 such as a baseband chipset, and a memory system 1010. In case that the computing system 1080 is a mobile device, a battery (not shown) for supplying an operation voltage of the computing system 1000 may be further provided. Some embodiments of the computing system 1000 may further include an application chipset, a camera image processor CIS, a mobile DRAM, or other devices, which are not shown. The memory system 1010 may include an SSD using for example a non-volatile memory for storing data. The memory system 1010 may be applied to a fusion flash memory, e.g. OneNAND flash memory as illustrated in FIG. 9.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device, the method comprising:
    operating a first program loop, the first program loop including
        performing a first program operation, the first program operation including
            supplying a program inhibition voltage to unselected bit lines of program inhibition cells, the program inhibition cells being memory cells coupled to a selected word line that are not selected,
            supplying a first program allowable voltage to selected bit lines of program allowable cells, the program allowable cells being memory cells coupled to the selected word line that are selected, and
            supplying a program voltage to the selected word line, and performing a program verifying operation for the memory cells; and
    operating a second program loop, the second program loop including
        performing a second program operation, the second program operation including
            supplying the program inhibition voltage to the unselected bit lines,
            supplying a second program allowable voltage to the selected bit lines,
            supplying the program voltage to the selected word line, and
            performing the program verification,
    wherein the second program allowable voltage is a voltage between the first program allowable voltage and the program inhibition voltage; and
    wherein one of the first program allowable voltage and the second program allowable voltage is supplied to selected bit lines based on the program voltage supplied to the selected word line and a number of loops for the first and second loops.

2. The method of claim 1, wherein the program voltage increases by a first step voltage whenever the first program loop is repeated, and the program voltage increases by a second step voltage higher than the first step voltage whenever the second program loop is repeated.

3. The method of claim 2, wherein the first program loop is repeated in the event that the program voltage is lower than a reference voltage, and the second program loop is performed in the event that the program voltage is higher than the reference voltage.

4. The method of claim 3, wherein the first program loop is performed again after the second program loop is performed repetitively by an allowable number of times.

5. The method of claim 1, wherein the first program allowable voltage includes a ground voltage.

6. The method of claim 1, wherein the first program loop is performed in an operation of storing LSB data in the memory cells, and the second program loop is performed in an operation of storing MSB data in the memory cells.

7. The method of claim 6, wherein the first program loop is performed again after the second program loop is performed repetitively by the allowable number of times in the operation of storing the MSB data.

8. The method of claim 1, wherein the second program loop is performed again in an operation of increasing threshold voltage of the memory cell to a third program level that is higher than an erase level, a first program level, and a second program level.

9. The method of claim 8, wherein the first program loop is performed again after the second program loop is performed repetitively by the allowable number of times in the operation of increasing the threshold voltage of the memory cell to the third program level.

10. A semiconductor memory device comprising:
    a memory block configured to include memory cells coupled to word lines; and
    a peripheral circuit configured to perform a first program loop that includes a first program operation and a program verifying operation and a second program loop that includes a second program operation and the program verifying operation for memory cells coupled to a word line selected from the word lines, and supply program allowable voltages having different levels to selected bit lines of program allowable cells located between program inhibition cells during the first program loop and the second program loop;

wherein one of the program allowable voltages is supplied to the selected bit lines based on a program voltage supplied to the selected word line and a number of loops for the first and second loops.

11. The semiconductor memory device of claim 10, wherein the peripheral circuit increases a program voltage supplied to the selected word line by a first step voltage whenever the first program loop is repeated, and increases the program voltage by a second step voltage higher than the first step voltage whenever the second program loop is repeated.

12. The semiconductor memory device of claim 11, wherein the peripheral circuit repeats the first program loop in the event that the program voltage is lower than a reference voltage, and performs the second program loop in the event that the program voltage is higher than the reference voltage.

13. The semiconductor memory device of claim 12, wherein the peripheral circuit repeats the first program loop after the second program loop has been performed repetitively by an allowable number of times.

14. The semiconductor memory device of claim 10, wherein the first program allowable voltage includes a ground voltage, and the second program allowable voltage is higher than the first program allowable voltage and lower than the program inhibition voltage supplied to unselected bit lines of the program inhibition cells.

15. The semiconductor memory device of claim 10, wherein the peripheral circuit repetitively performs the first program loop in an operation of storing LSB data in the memory cells, and repetitively performs the second program loop in an operation for storing MSB data in the memory cells.

16. The semiconductor memory device of claim 15, wherein the peripheral circuit performs again the first program loop after the second program loop has been performed repetitively by the allowable number of times in the operation of storing the MSB data.

17. The semiconductor memory device of claim 10, wherein the peripheral circuit performs repetitively the second program loop in an operation of increasing a threshold voltage of the memory cell to a third program level which is higher than an erase level, a first program level, and a second program level.

18. The semiconductor memory device of claim 17, wherein the peripheral circuit performs again the first program loop after the second program loop is repetitively performed the allowable number of times in the operation of increasing the threshold voltage of the memory cell to the third program level.

* * * * *